(12) United States Patent
Zhang et al.

(10) Patent No.: US 12,495,584 B2
(45) Date of Patent: Dec. 9, 2025

(54) LOGIC GATE DEVICE

(71) Applicants: Tsinghua University, Beijing (CN);
HON HAI PRECISION INDUSTRY CO., LTD., New Taipei (TW)

(72) Inventors: Guang-Qi Zhang, Beijing (CN); Yang Wei, Beijing (CN); Shou-Shan Fan, Beijing (CN)

(73) Assignees: Tsinghua University, Beijing (CN);
HON HAI PRECISION INDUSTRY CO., LTD., New Taipei (TW)

( * ) Notice: Subject to any disclaimer, the term of this patent is extended or adjusted under 35 U.S.C. 154(b) by 397 days.

(21) Appl. No.: 18/220,868

(22) Filed: Jul. 12, 2023

(65) Prior Publication Data
US 2024/0063296 A1    Feb. 22, 2024

(30) Foreign Application Priority Data
Aug. 19, 2022 (CN) .......................... 202210998851.4

(51) Int. Cl.
H10D 48/36 (2025.01)
H03K 19/08 (2006.01)
H10D 48/32 (2025.01)
H10D 62/80 (2025.01)

(52) U.S. Cl.
CPC .......... H10D 48/366 (2025.01); H03K 19/08 (2013.01); H10D 48/362 (2025.01); H10D 62/80 (2025.01)

(58) Field of Classification Search
None
See application file for complete search history.

(56) References Cited

U.S. PATENT DOCUMENTS

| | | | |
|---|---|---|---|
| 2013/0196463 A1* | 8/2013 | Zhu | H10D 62/8303 438/52 |
| 2021/0242399 A1 | 8/2021 | Lee et al. | |
| 2023/0207633 A1* | 6/2023 | Suto | H03K 19/0013 257/213 |

* cited by examiner

*Primary Examiner* — Xiaoming Liu
(74) *Attorney, Agent, or Firm* — ScienBiziP, P.C.

(57) ABSTRACT

The present application provides a logic gate device. The logic gate device includes a gate electrode, a gate insulating layer, a bottom electrode, a two-dimensional semiconductor layer, a first top electrode and a second electrode. The gate insulating layer is located on the gate electrode. The bottom electrode is located on the gate insulating layer. The two-dimensional semiconductor layer is located on the bottom electrode and simultaneously covers the gate insulating layer. The first top electrode and the second electrode are located on the two-dimensional semiconductor layer. The bottom electrode, the two-dimensional semiconductor layer and the gate insulating layer form an air gap, and the air gap is distributed at both sides of the bottom electrode. The gate electrode is configured to connect a gate voltage, and the first top electrode and the second top electrode are configured to connect a signal input terminal.

13 Claims, 34 Drawing Sheets

LOGIC GATE DEVICE

CROSS-REFERENCE TO RELATED APPLICATIONS

This application claims all benefits under 35 U.S.C. § 119 from the Chinese Patent Application No. 202210998851.4, filed on Aug. 19, 2022, in the China National Intellectual Property Administration, the disclosure of which is incorporated herein by reference.

FIELD

The present application relates to a logic gate device.

BACKGROUND

Semiconductor industry has entered the post-Moore era as the silicon-based field-effect transistors (FETs) approach the fundamental physical limit. Two-dimensional (2D) semiconductor materials held together by van der Waals forces have become an important candidate for next-generation electronics. A 2D semiconductor material with high quality usually exhibits ambipolar electrical behavior, in which charge carriers can be switched between electrons and holes by an electrostatic field. However, the ambipolar electrical behavior of the 2D semiconductor materials is a double-edged sword. An ambipolar transistor can only be turned off within a narrow gate-voltage range because of a continuous transition between an electron-conduction state and a hole-conduction state, leading to a problem that a logic function is difficult to turn off.

It is a feasible solution to convert the ambipolar electrical behavior to a unipolar behavior by doping or contact engineering. Surface dopants and adsorbates can tune a polarity of 2D semiconductors, but they are not stable and may degrade intrinsic electronic properties of the 2D semiconductors. Electrical contacts can also govern a transport polarity of ambipolar 2D semiconductors via appropriate band alignment for electrons and holes injection, but they are limited by the Fermi level pinning effect. However, logic gates generally include N-type semiconductors and P-type semiconductors. Since the bipolarity of two-dimensional semiconductors is difficult to convert into unipolarity, it is impossible to use these two-dimensional semiconductors to directly prepare logic gates with stable performance.

Therefore, there is room for improvement in the art.

BRIEF DESCRIPTION OF THE DRAWINGS

In order to illustrate the technical solutions of the embodiments of the present application more clearly, the accompanying drawings in the embodiments will be briefly introduced below. It should be understood that the following drawings only show some embodiments of the present application, and therefore should not be seen as limiting the scope. For one of ordinary skill in the art, other related drawings can also be obtained from these drawings without any creative work.

Implementations of the present technology will now be described, by way of embodiments, with reference to the attached figures, wherein.

DETAILED DESCRIPTION

Figure 1:
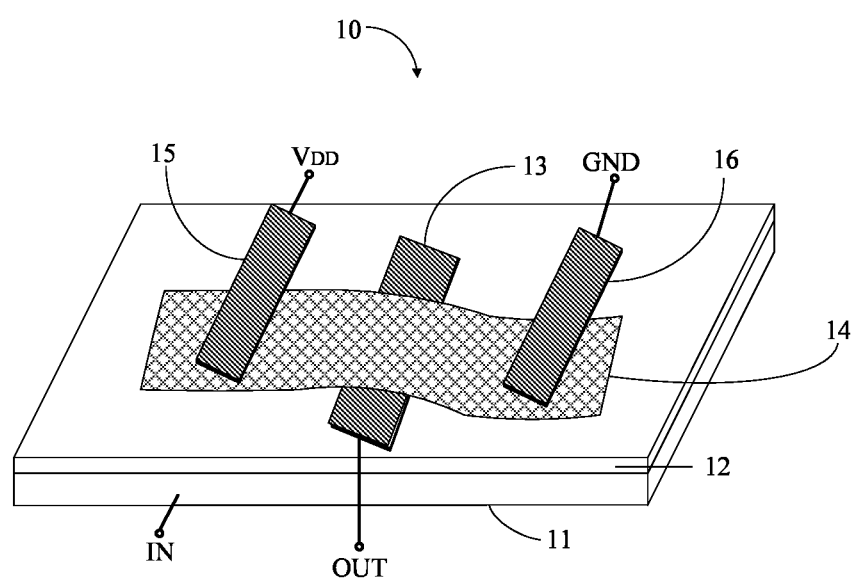
FIG. 1 is a structural diagram of an inverter according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale, and the proportions of certain parts may be exaggerated better illustrate details and features. The description is not to be considered as limiting the scope of the embodiments described herein.

The term "outside" refers to a region that is beyond the outermost confines of a physical object. The term "inside" indicates that at least a portion of a region is partially contained within a boundary formed by the object. The term "substantially" is defined to essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like. It should be noted that references to "an" or "one" embodiment in this disclosure are not necessarily to the same embodiment, and such references mean at least one.

Figure 2:
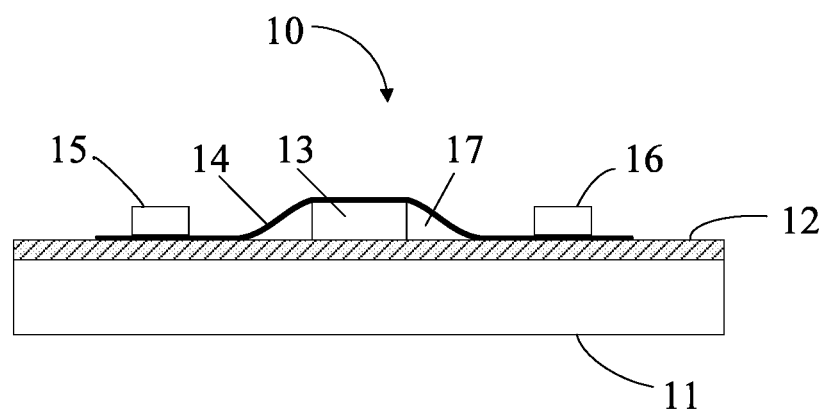
FIG. 2 is a sectional diagram of the inverter according to the embodiment of the present disclosure.
Figure 3:
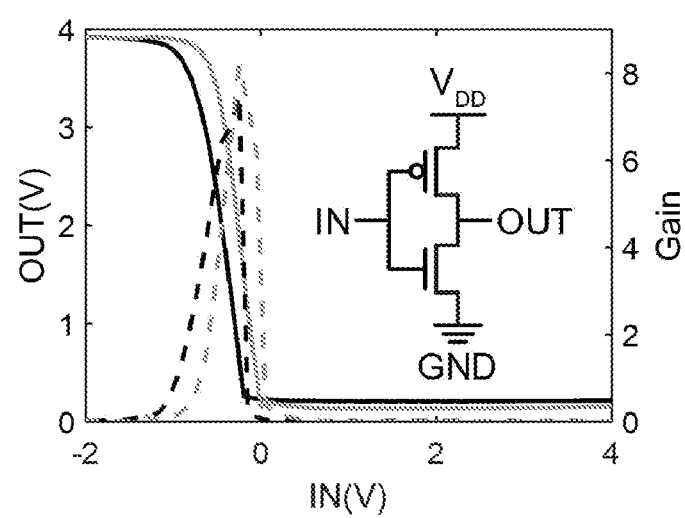
FIG. 3 is an equivalent circuit diagram and test result diagram of the inverter according to the embodiment of the present disclosure.

Referring to FIGS. 1-3, a first embodiment of an inverter 10 is provided. The inverter 10 comprises a gate electrode 11, a gate insulating layer 12, a bottom electrode 13, a two-dimensional semiconductor layer 14, a first top electrode 15 and a second top electrode 16. The gate insulating layer 12 is disposed on a surface of the gate electrode 11. The bottom electrode 13 is disposed on a surface of the gate insulating layer 12 away from the gate electrode 11. The two-dimensional semiconductor layer 14 is disposed on a surface of the bottom electrode 13 away from the gate insulating layer 12 and simultaneously covers the surface of the gate insulating layer 12. That is, a part of the two-dimensional semiconductor layer 14 is in direct contact with a part of the gate insulating layer 12. The bottom electrode 13, the two-dimensional semiconductor layer 14 and the gate insulating layer 12 form an air gap 17, and the air gap 17 is distributed on both sides of the bottom electrode 13. The first top electrode 15 and the second top electrode 16 are arranged on a surface of the two-dimensional semiconductor layer 14 away from the gate insulating layer 12, and the first top electrode 15 and the second top electrode 16 are located on opposite sides of the bottom electrode 13. The gate electrode 11 is configured to connect a signal input end, and the bottom electrode 13 is configured to connect a signal output end. The first top electrode 15 is configured to connect a positive voltage of a power supply, and the second top electrode 16 is configured to connect a ground terminal.

A material of the gate 11 can be a conductive material, and the conductive material can be metal, indium tin oxide (ITO), heavily doped silicon, conductive silver glue, conductive polymer or conductive carbon nanotubes. The metal can be aluminum, copper, tungsten, molybdenum, gold, titanium, palladium, or alloys in any combination. A material of the gate insulating layer 12 can be insulating material such as aluminum oxide, hafnium oxide, silicon nitride, and silicon oxide. The thickness of the gate insulating layer 12 can be set as required. In one embodiment, the gate electrode 11 is a heavily doped silicon wafer, the gate insulating layer 12 is a silicon dioxide layer, and the thickness of the silicon dioxide layer is 300 nanometers.

The bottom electrode 13 is made of conductive material, and the conductive material can be metal, ITO, conductive silver glue, conductive polymer, graphene, or conductive carbon nanotubes. The metal can be aluminum, iron, germanium, copper, tungsten, molybdenum, gold, titanium, palladium, or alloys containing metallic materials. The bottom electrode 13 is disposed on the surface of the gate insulating layer 12 away from the gate electrode 11. In one embodiment, the bottom electrode 13 is disposed on the middle of the gate insulating layer 12.

The bottom electrode 13 can be formed on the surface of the gate insulating layer 12 by electron beam deposition, magnetron sputtering and the like. In one embodiment, the bottom electrode 13 is a composite structure of Ti and Au formed by sequentially evaporating a 5 nm-thick Ti bonding layer and a 55 nm-thick Au conductor layer by electron beam evaporation deposition.

The material of the two-dimensional semiconductor layer 14 can be black phosphorus (BP), molybdenum telluride ($MoTe_2$), tungsten selenide ($WSe_2$), semiconducting carbon nanotubes and the like. When the two-dimensional semiconductor layer 14 is a semiconducting carbon nanotube layer, the semiconducting carbon nanotube layer comprises a plurality of uniformly distributed semiconducting carbon nanotubes, and the plurality of semiconducting carbon nanotubes are connected by van der Waals attractive force. The plurality of semiconducting carbon nanotubes is arranged in order or in disorder. When the semiconducting carbon nanotube layer comprises disorderly arranged semiconducting carbon nanotubes, the semiconducting carbon nanotubes are intertwined or arranged isotropically. When the semiconducting carbon nanotube layer includes orderly arranged semiconducting carbon nanotubes, the semiconducting carbon nanotubes are basically arranged along a same direction. The two-dimensional semiconductor layer 14 can be a freestanding structure, that is, the two-dimensional semiconductor layer 14 can be supported by itself without a substrate. For example, if at least one point of the two-dimensional semiconductor layer 14 is held, the entire two-dimensional semiconductor layer can be lifted without being destroyed.

The thickness of the two-dimensional semiconductor layer 14 is in a range from 5 nanometers to 20 nanometers. In one embodiment, the thickness of the two-dimensional semiconductor layer 14 is 10.8 nm, and the material of the two-dimensional semiconductor layer 14 is tungsten selenide. The two-dimensional semiconductor layer 14 is a layered structure with flexibility and good mechanical strength. Since the two-dimensional semiconductor layer 14 is a flexible structure, when a part structure of the two-dimensional semiconductor layer 14 is overlapped on the surface of the bottom electrode 13 away from the gate insulating layer 12, another part structure of the two-dimensional semiconductor layer 14 can be tiled on the surface of the gate insulating layer 12 away from the gate electrode 11. The two-dimensional semiconductor layer 14 is an integral structure, and the two-dimensional semiconductor layer 14 extends from the surface of the bottom electrode 13 to the surface of the gate insulating layer 12. The two-dimensional semiconductor layer 14 can be disposed in direct contact with the gate insulating layer 12 and the bottom electrode 13 at the same time. Since the bottom electrode 13 is arranged on the surface of the gate insulating layer 12 and has a certain thickness, and the two-dimensional semiconductor layer 14 has high flexibility and mechanical strength, when the two-dimensional semiconductor layer 14 overlaps the bottom electrode 13, the bottom electrode 13, the gate insulating layer 12 and the two-dimensional semiconductor layer 14 can form the air gap 17 having a triangular shape. Since the bottom electrode 13 is arranged on the middle of the gate insulating layer 12, when the two-dimensional semiconductor layer 14 overlaps the bottom electrode 13, the air gap 17 is formed on both sides of the bottom electrode 13. Since the dielectric constant of air is lower than that of the gate insulating layer 12, the equivalent dielectric layer of the air gap 17 is much thicker than that of the gate insulating layer 12. Therefore, this air gap structure can significantly reduce the electrostatic doping caused by the gate electrode 11.

The first top electrode 15 and the second top electrode 16 can be conductive materials. The conductive materials can be metal, ITO, conductive silver glue, conductive polymer, graphene, or conductive carbon nanotubes. The metal can be aluminum, iron, germanium, copper, tungsten, molybdenum, gold, titanium, palladium, or alloys containing metallic materials. The first top electrode 15 and the second top electrode 16 are located on a surface of the two-dimensional semiconductor layer 14 away from the gate insulating layer 12, and the first top electrode 15 and the second top electrode 16 are distributed on the opposite sides of the bottom electrode 13. Furthermore, the first top electrode 15 and the second top electrode 16 are in direct contact with the surface of the two-dimensional semiconductor layer 14, and the first top electrode 15 and the second top electrode 16 are both far away from the air gap 17, and oppositely arranged on both sides of the air gap 17. At a position where the first top electrode 15 is in contact with the two-dimensional semiconductor layer 14, the two-dimensional semiconductor layer 14 is directly attached to the surface of the gate insulating layer 12. And at a position where the second top electrode 16 is in contact with the two-dimensional semiconductor layer 14, the two-dimensional semiconductor layer 14 is directly attached to the surface of the gate insulating layer 12.

The first top electrode 15 and the second top electrode 16 can be formed on the surface of the two-dimensional semiconductor layer 14 by electron beam deposition method, magnetron sputtering method and the like. In one embodiment, the first top electrode 15 and the second top electrode 16 are formed by evaporating an Au layer with a thickness of 50 nanometers by electron beam evaporation deposition method.

Referring to FIG. 3, the gate electrode 11 is a signal input terminal IN of the inverter 10, the bottom electrode 13 is a signal output terminal OUT of the inverter 10, and the first top electrode 15 is connected to the positive voltage VDD of the power supply, and the second top electrode 16 is connected to the ground terminal GND. Furthermore, the voltages connected to the first top electrode 15 and the second top electrode 16 can be interchanged, that is, the first top electrode 15 is connected to the ground terminal GND, and the second top electrode 16 is connected to the positive voltage VDD of the power supply. The solid line in FIG. 3 represents the output of the inverter 10, the dotted line represents the gain of the inverter 10, and the black curve represents the test results before the VDD terminal and GND terminal are interchanged, and the gray curve represents the test results after the VDD terminal and GND terminal are interchanged. It can be seen from the figure that the gain of the inverter 10 can be close to 10, and the electrical performance remains almost unchanged after the VDD terminal and the GND terminal are exchanged.

Figure 4:
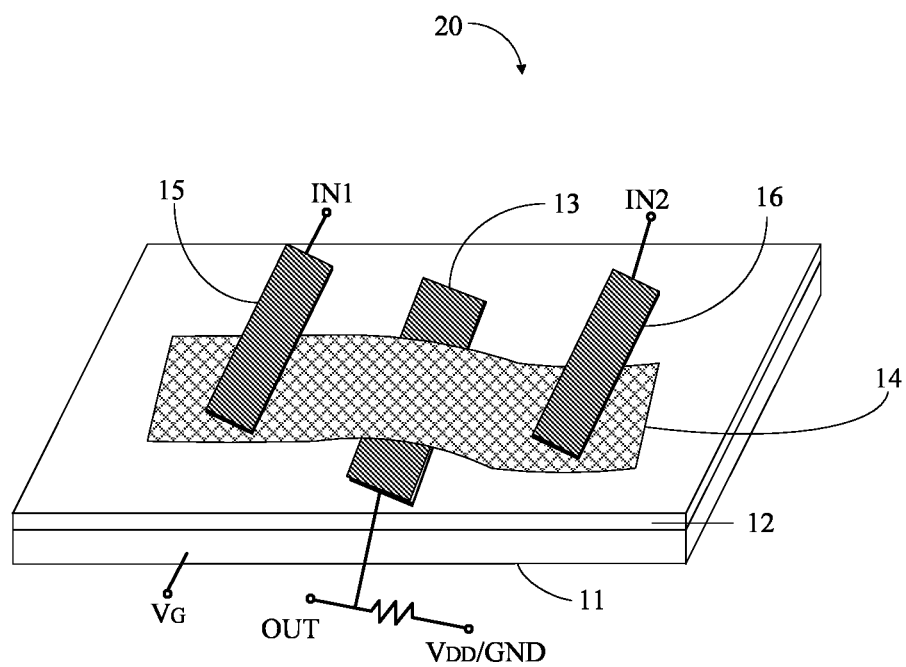
FIG. 4 is a structural diagram of a logic gate device according to an embodiment of the present disclosure.
Figure 5:
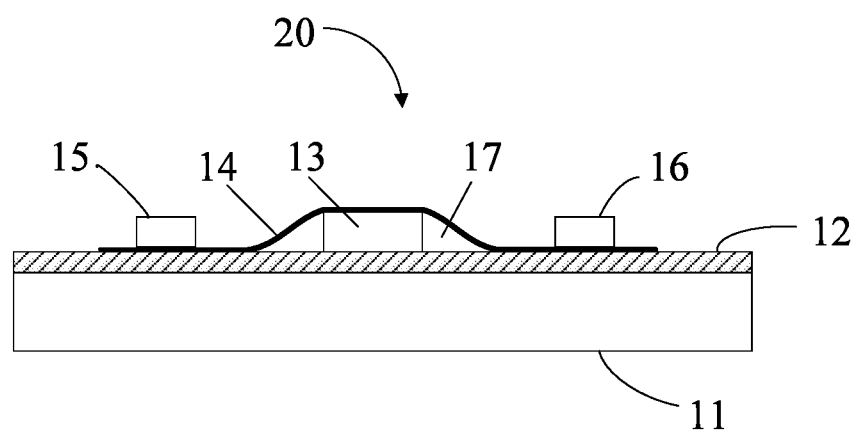
FIG. 5 is a sectional diagram of the logic gate device according to the embodiment of the present disclosure.
Figure 6:
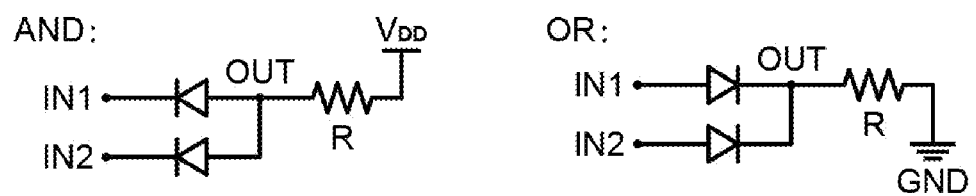
FIG. 6 is an equivalent circuit diagram of the logic gate device according to the embodiment of the present disclosure.

Referring to FIGS. 4-6, a second embodiment of a logic gate device 20 is provided. The logic gate device 20 includes a gate electrode 11, a gate insulating layer 12, a bottom electrode 13, a two-dimensional semiconductor layer 14, a first top electrode 15 and a second top electrode 16. The gate insulating layer 12 is located on a surface of the gate electrode 11. The bottom electrode 13 is located on a surface of the gate insulating layer 12 away from the gate electrode 11. The two-dimensional semiconductor layer 14 is located on a surface of the bottom electrode 13 away from the gate insulating layer 12 and simultaneously covers a surface of the gate insulating layer 12. That is, a part of the two-dimensional semiconductor layer 14 is in direct contact with a part of the gate insulating layer 12. The bottom electrode 13, the two-dimensional semiconductor layer 14 and the gate insulating layer 12 form an air gap 17, and the air gap 17 is distributed on both sides of the bottom electrode 13. The first top electrode 15 and the second top electrode 16 are located on a surface of the two-dimensional semiconductor layer 14 away from the gate insulating layer 12, and the first top electrode 15 and the second top electrode 16 are located at both sides of the bottom electrode 13.

The gate electrode 11 is configured to connect the gate voltage $V_G$, the first top electrode 15 and the second top electrode 16 are configured to connect a signal input terminal, and the bottom electrode 13 is configured to connect a signal output terminal and a working voltage. The working voltage can be a positive voltage $V_{DD}$ of a power supply, or a ground terminal GND.

The logic gate device 20 of the second embodiment is similar to the inverter 10 of the first embodiment except that a circuit connection mode of the logic gate device 20 is completely different from that of the inverter 10, and the logic gate device 20 can be used for an AND gate (AND) or an OR gate (OR).

Figure 7:
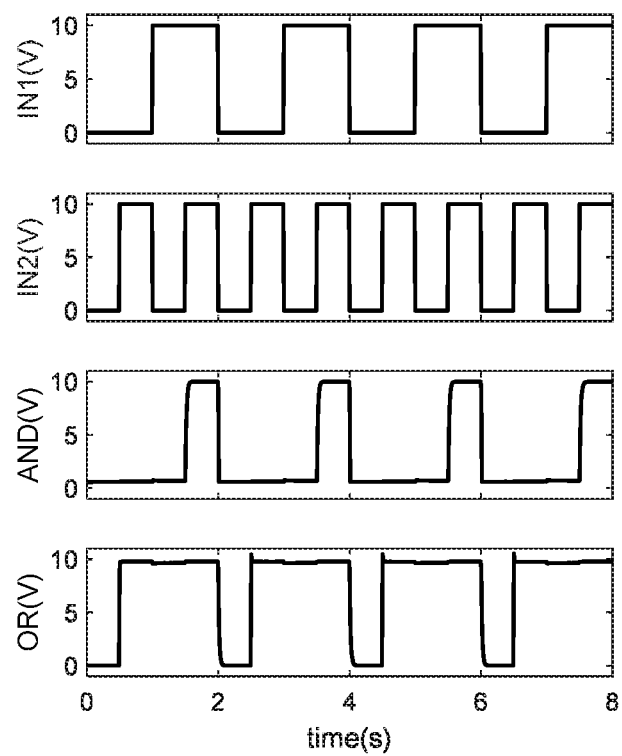
FIG. 7 is a test result diagram of the logic gate device according to the embodiment of the present disclosure.

Referring to FIG. 6 and FIG. 7, when the gate voltage $V_G$ is 60V and the working voltage is $V_{DD}$=10V, the logic gate device 20 behaves as the AND gate; when the gate voltage $V_G$ is −60V and the working voltage is GND, the logic gate device 20 behaves as an OR gate.

The advantages of the inverter 10 and the logic gate device 20 are described below. There is an air gap formed by the bottom electrode, the two-dimensional semiconductor layer and the gate insulating layer in the structures of the inverter and the logic gate device, and the top electrode is located on an upper surface of the two-dimensional semiconductor layer and the bottom electrode is located on a lower surface of the two-dimensional semiconductor layer. And there is no air gap at the top electrode. Therefore, the air gap can make the Schottky barrier around the bottom electrode significantly wider than that around the top electrode, so that the barrier transistor with this air gap has a good on-off ratio and reconfigurable rectification characteristics. Furthermore, the gain of the inverter formed by a p-type transistor and a n-type transistor with the above structure can reach about 10; and the logic gate device formed by the p-type transistor and the n-type transistor with the above structure can effectively switch AND/OR logic.

Figure 8:
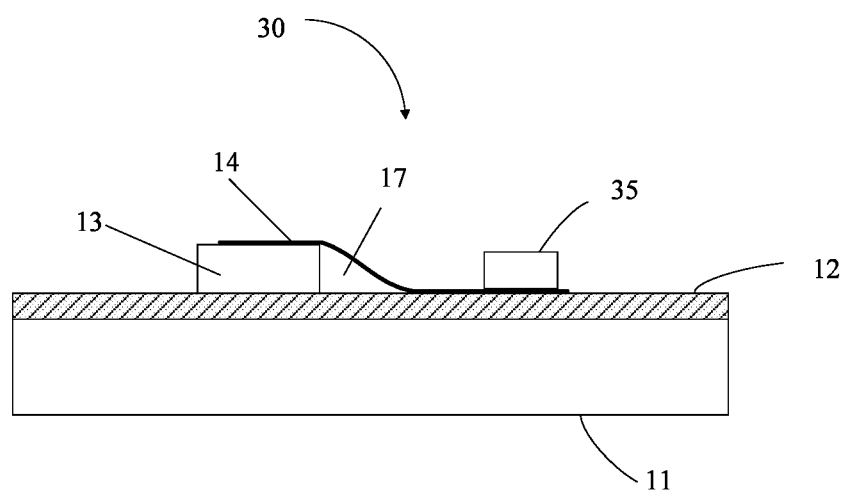
FIG. 8 is a structural diagram of a barrier transistor with an air gap according to an embodiment of the present disclosure.

Referring to FIG. 8, in order to explain the electrical performance of the inverter 10 and the logic gate device 20, a barrier transistor 30 having the air gap is analyzed and illustrated. A barrier transistor 30 includes a gate electrode 11, a gate insulating layer 12, a bottom electrode 13, a two-dimensional semiconductor layer 14, and a top electrode 35. The gate insulating layer 12 is located on a surface of the gate electrode 11. The bottom electrode 13 is disposed on a surface of the gate insulating layer 12 away from the gate electrode 11. The two-dimensional semiconductor layer 14 is disposed on a surface of the bottom electrode 13 away from the gate insulating layer 12 and simultaneously covers the surface of the gate insulating layer 12. The bottom electrode 13, the two-dimensional semiconductor layer 14 and the gate insulating layer 12 form an air gap 17. The top electrode 35 is disposed on a surface of the two-dimensional semiconductor layer 14 away from the gate insulating layer 12. The bottom electrode 13 is used as a drain electrode, and the top electrode 35 is used as a source electrode, the source electrode and the drain electrode are connected to a voltage $V_{DS}$, and the gate electrode 11 is connected to a voltage $V_G$. The inverter 10 and the logic gate 20 form "back-to-back" structures on a basis of the barrier transistor 30. Therefore, the present application uses the electrical variation of the barrier transistor 30 to verify the electrical performance of the inverter 10 and the logic gate 20.

Figure 9:
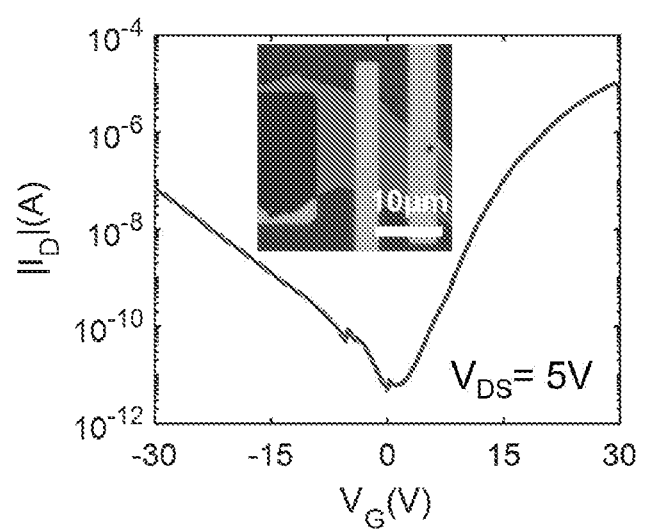
FIG. 9 is a diagram of transfer characteristic of the barrier transistor according to the embodiment of the present disclosure.
Figure 10:
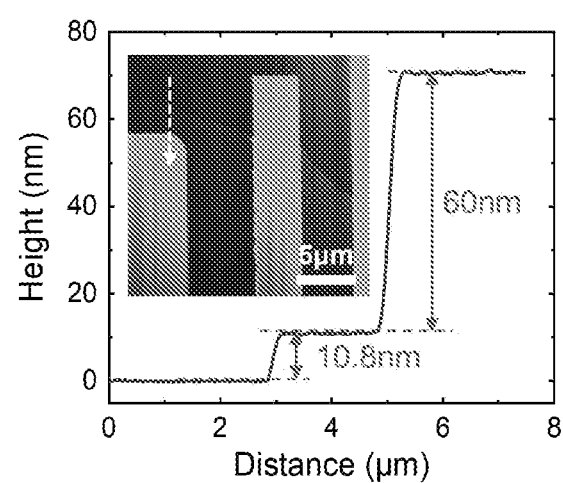
FIG. 10 is a height information diagram of the barrier transistor according to the embodiment of the present disclosure.
Figure 11:
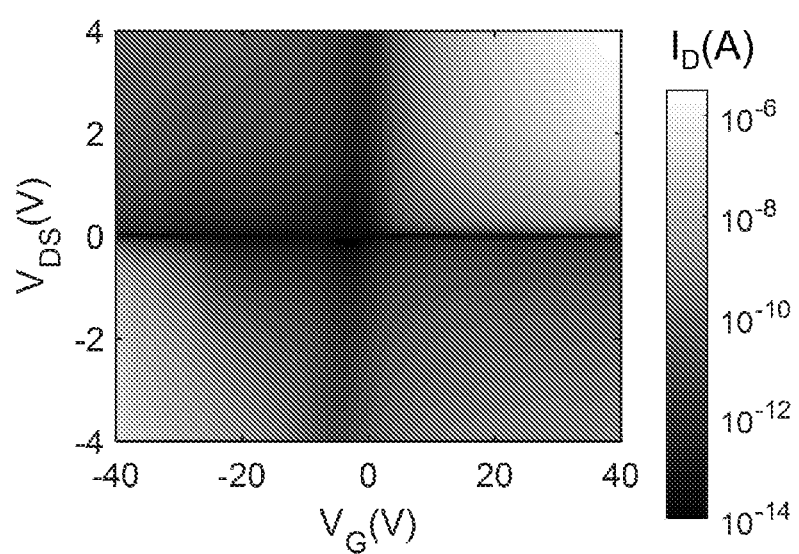
FIG. 11 is a diagram of electrical transport characteristics of the barrier transistor according to the embodiment of the present disclosure.
Figure 12:
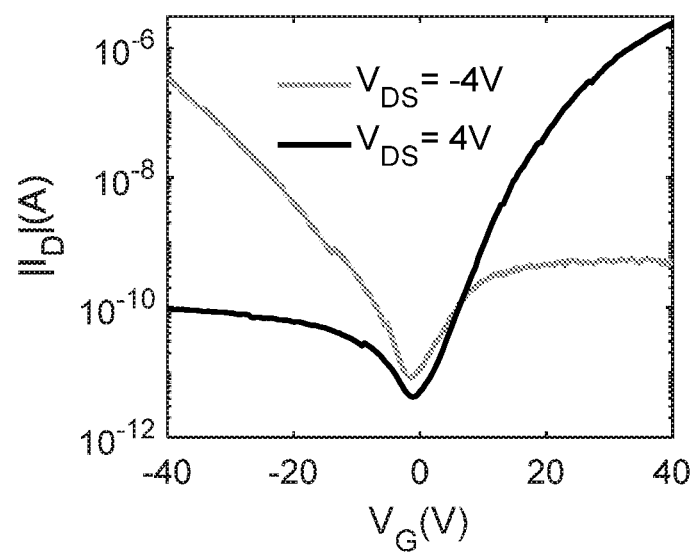
FIG. 12 is a transfer curve diagram of the barrier transistor according to the embodiment of the present disclosure when the $V_{DS}$ is +4V and −4V respectively.
Figure 13:
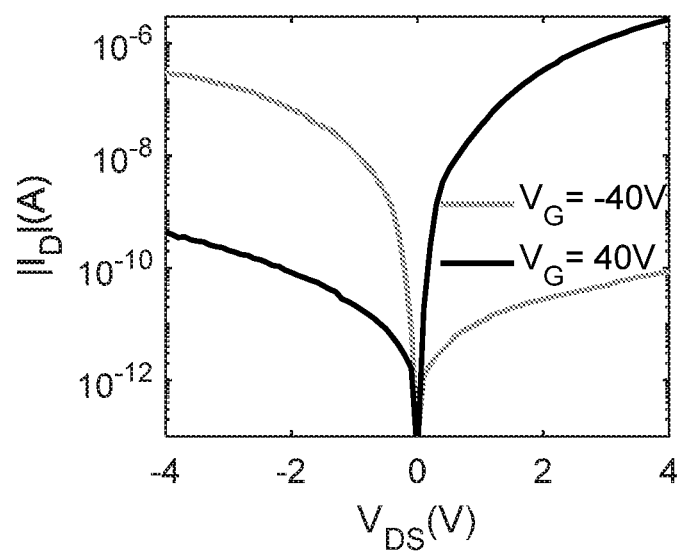
FIG. 13 is an output curve diagram of the barrier transistor according to the embodiment of the present disclosure when $V_{DS}$ is positive or negative.

In the test of the electrical performance of the barrier transistor 30, the material of the two-dimensional semiconductor layer 14 is $WSe_2$. Referring to FIG. 9, according to the transfer characteristic diagram of the barrier transistor 30, it can be seen that the barrier transistor 30 exhibits typical bipolar behavior and near-neutral semiconductor characteristics. Referring to FIG. 10, the material of the two-dimensional semiconductor layer 14 is $WSe_2$ flake, and the thickness of the $WSe_2$ flake is 10.8 nanometers. The height information is obtained by setting another electrode on the surface of the two-dimensional semiconductor layer 14 and then testing the electrical properties of the two top electrodes. Referring to FIG. 11, according to the electrical transport characteristic diagram of the barrier transistor 30, it can be seen that the barrier transistor 30 is turned on in the first quadrant ($+V_G$, $+V_{DS}$) and the third quadrant ($-V_G$, $-V_{DS}$), thus the barrier transistor 30 is in a conducting state, as shown by the light-colored corner in FIG. 11. When the barrier transistor 30 is in the second quadrant ($-V_G$, $+V_{DS}$) and the fourth quadrant ($+V_G$, $-V_{DS}$), half of the ON state of the bipolar channel is effectively turned off, as shown by the dark edge in FIG. 11. Therefore, when $V_{DS}$ is positive, the barrier transistor 30 is reconfigured as an n-type transistor, and when $V_{DS}$ is negative, the barrier transistor 30 is reconfigured as a p-type transistor. Referring to FIG. 12, when $V_{DS}$ is +4V or $V_{DS}$ is +4V, the on-off ratio of n-type transistors or p-type transistors is about $10^3$. Referring to FIG. 13, the barrier transistor 30 can exhibit a reconfigurable rectification behavior, which is forward at $+V_G$ and reverse at $-V_G$. When $V_G$=+40V/−40V, the rectification ratio of the barrier transistor 30 can exceed $10^3$.

Figure 14:
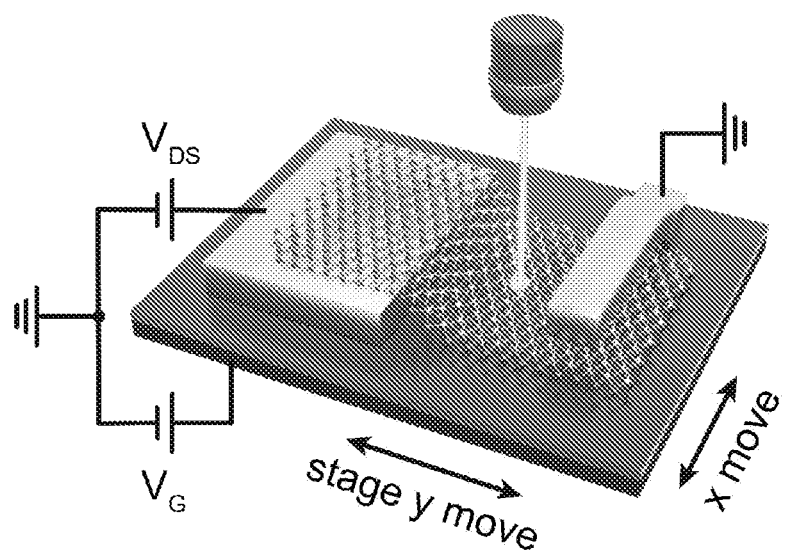
FIG. 14 is a structural diagram of the barrier transistor irradiated by a scanning photocurrent microscope (SPCM).
Figure 15:
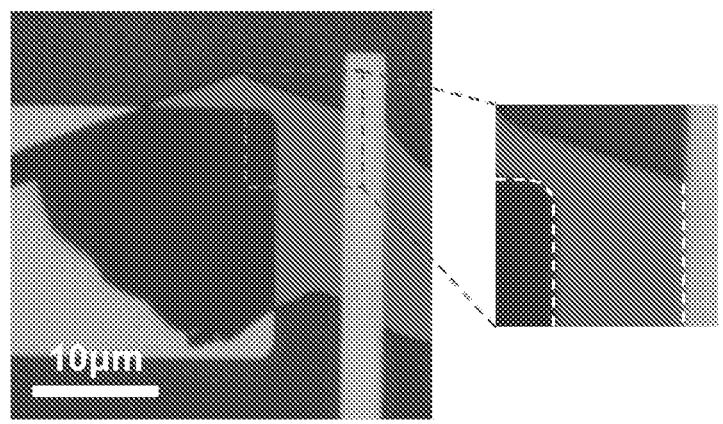
FIG. 15 is a laser beam scanning position diagram of the barrier transistor according to the embodiment of the present disclosure.
Figure 16:
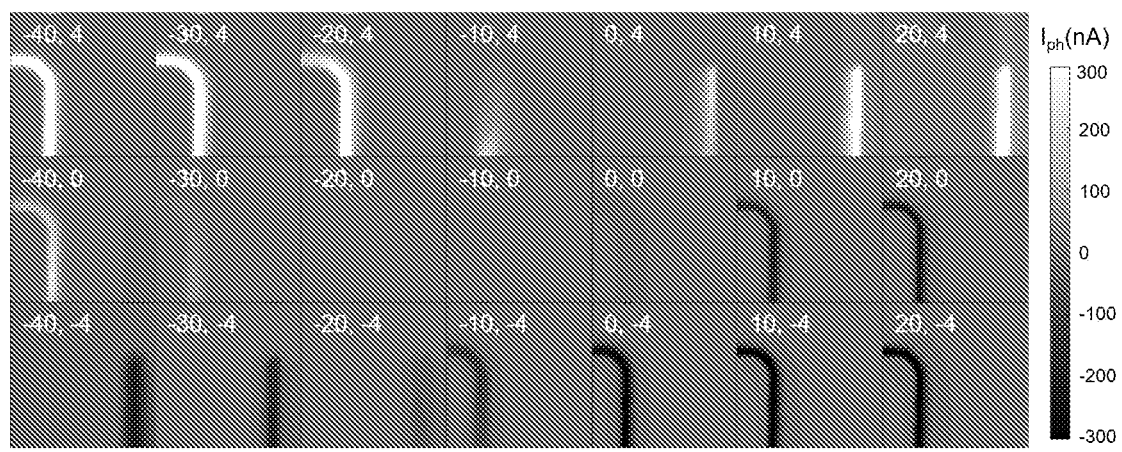
FIG. 16 is an SPCM diagram of the barrier transistor under different $V_G$ values and $V_{DS}$ values.

In order to verify the reconfigurable mechanism of the barrier transistor 30, the present application further uses a scanning photocurrent microscope (SPCM) to measure the barrier transistor 30. Referring to FIG. 14 to FIG. 16, the SPCM is configured to scan the barrier transistor 30 with a focused laser beam to record a photocurrent and a position. The 10 μm×10 μm dotted square in FIG. 15 is used as a scanning area, and FIG. 16 shows the corresponding SPCM image arranged in ($V_G$, $V_{DS}$). Among them, $V_G$ changes from −40V to 20V with a step size of 10V, and $V_{DS}$ is set to −4V, 0V, and 4V respectively. And The SPCM image of FIG. 16 is in good agreement with the electrode profile marked with dotted lines in FIG. 15. The gradual transition of the SPCM image in FIG. 16 is related to the transformation of $V_G$ value and $V_{DS}$ value. For example, in the middle row where $V_{DS}$ is 0 V, the photocurrent only appears at the edge of the bottom electrode and the $V_G$ can be used to analyze the distribution of the built-in electric field depending on the $V_G$ by switching.

When the barrier transistor 30 is in the states of (−$V_G$, +$V_{DS}$) and (+$V_G$, −$V_{DS}$), it corresponds to the OFF state (dark position) of the electrical characteristic diagram, the photocurrent around the edge of the bottom electrode becomes very strong. While the barrier transistor 30 is in the states of (−$V_G$, −$V_{DS}$) and (+$V_G$, +$V_{DS}$), it corresponds to the ON state (light-colored corners) of the electrical characteristic diagram, the photocurrent around the edge of the top electrode becomes very strong.

Figure 17:
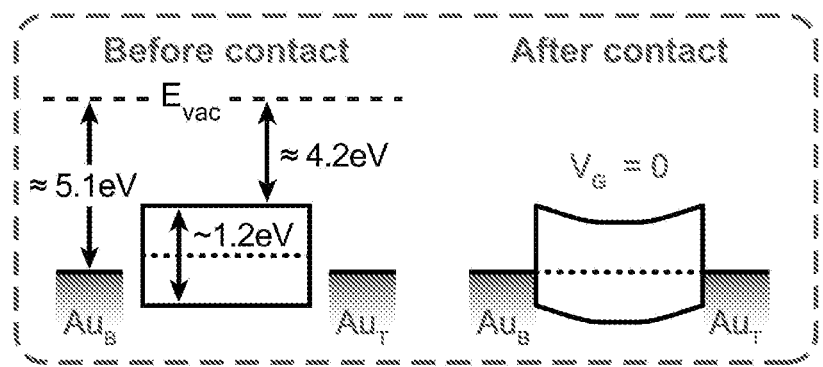
FIG. 17 is an energy band diagram of the barrier transistor before and after electrodes are in contact with a 2D semiconductor layer.

From the middle row of the SPCM image of FIG. 16, it can be seen that the barrier transistor 30 shows a significant asymmetry between the bottom electrode 13 and the top electrode 35. Because a contact between the bottom electrode 13 (the top electrode 35) and the two-dimensional semiconductor layer 14 is a contact between the metal Au and the WSe2 layer, the work function of Au is 5.1 eV, and the electron affinity of $WSe_2$ is 4.2 eV and the band gap of $WSe_2$ is 1.2 eV. FIG. 17 shows the energy band arrangement of the barrier transistor before and after electrodes are in contact with a two-dimensional semiconductor layer. Since the Fermi level of Au is lower than that of neutral $WSe_2$, two opposing Schottky barriers are formed at the edge of the electrodes. However, according to the SPCM image of FIG. 16, the photocurrent mainly appears at the Schottky barrier around the bottom electrode, which indicates that the two opposite Schottky barriers are asymmetrical, and the Schottky barrier around the bottom electrode are sensitive to light.

Figure 18:
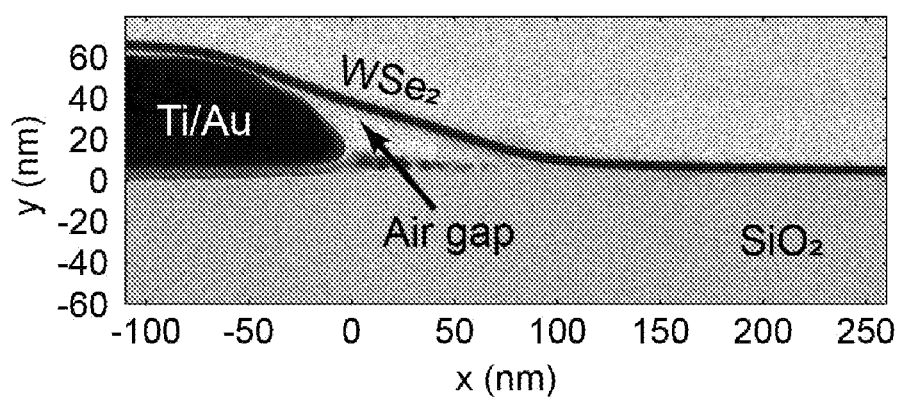
FIG. 18 is a scanning transmission electron microscopy of a bottom electrode of the barrier transistor with an air gap.
Figure 19:
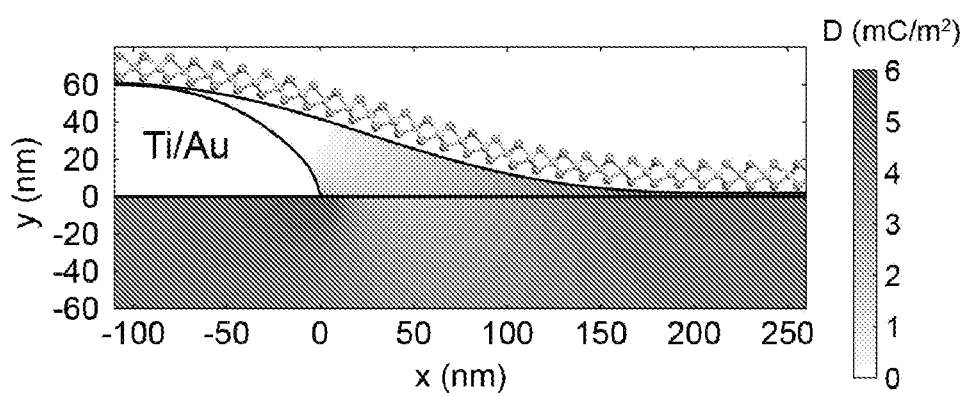
FIG. 19 is a potential displacement distribution diagram of the air gap of the barrier transistor.
Figure 20:
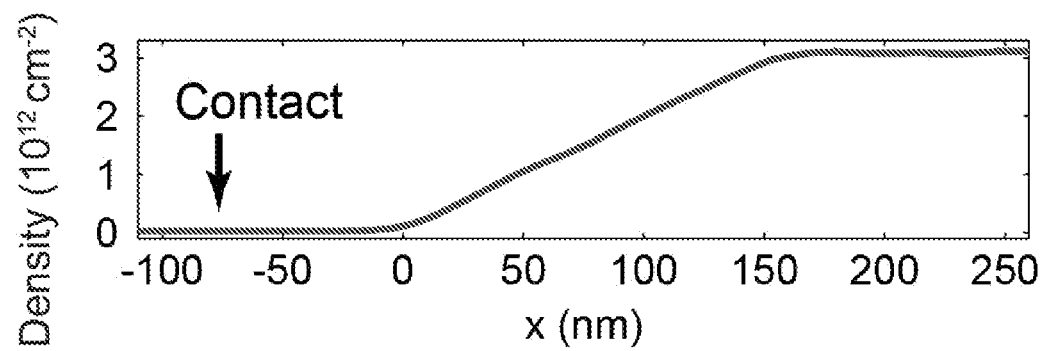
FIG. 20 is a diagram of a surface charge density distribution of a channel layer of the barrier transistor.

Referring to FIG. 18, due to the high mechanical strength of the $WSe_2$ layer, the $WSe_2$ layer can be supported on the edge of the bottom electrode and the surface of the gate insulating layer, forming a triangular void. Since the dielectric constant of air ($\varepsilon r \approx 1$) is much lower than that of $SiO_2$ ($\varepsilon r \approx 3.9$), the equivalent dielectric layer of the air gap is much thicker than that of 300 nm thick $SiO_2$. At the same time, the $WSe_2$ layer as a channel layer is in contact with the bottom electrode to form a contact part, and the contact part is electrically shielded. Thus, this specific air gap structure significantly reduces the electrostatic doping caused by the gate electrode potential. Referring to FIG. 19, the potential displacement distribution diagram of the air gap of the barrier transistor reveals that the air gap structure weakens the modulation of the gate electrode. Referring to FIG. 20, due to the existence of the air gap, there are obvious lightly doped regions around the contact position of the bottom electrode.

Figure 21:
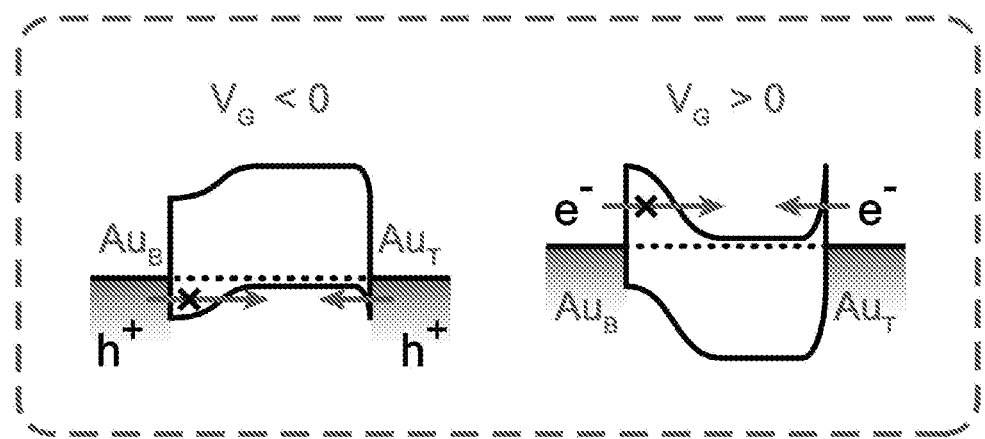
FIG. 21 is an energy band diagram of the barrier transistor at $-V_G$ values and $+V_G$ values.
Figure 22:
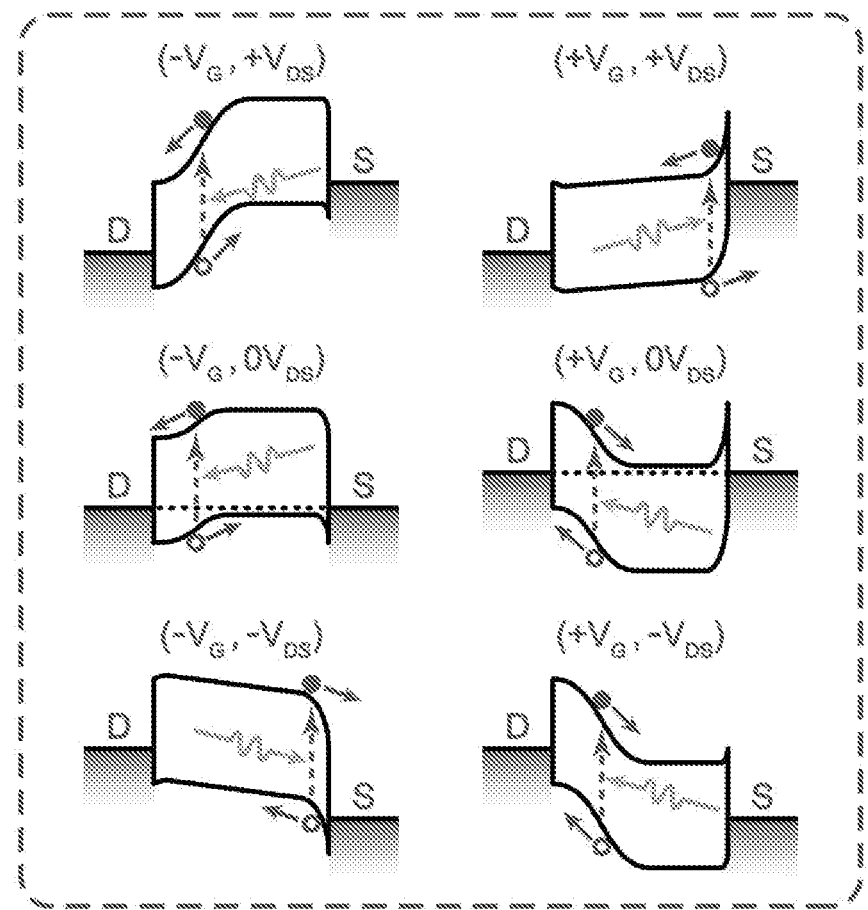
FIG. 22 is an energy band diagram of the barrier transistor under different $V_G$ values and $V_{DS}$ values.

Referring to FIG. 21, a widened Schottky barrier can effectively block the injection of charge carriers. Therefore, holes at −$V_G$ and electrons at +$V_G$ cannot be injected into the channel layer from the bottom electrode, which corresponds to the OFF state of the second quadrant and the fourth quadrant in FIG. 11; while holes and electrons can be injected from the top electrode through tunneling through the narrow Schottky barrier, which corresponds to the ON state of the first quadrant and the third quadrant in FIG. 11. Referring to FIG. 22, the energy band diagram corresponds to the SPCM diagram in FIG. 16. When the barrier transistor 30 is under the conditions of $(-V_G, +V_{DS})$ and $(+V_G, -V_{DS})$, that is, the barrier transistor 30 is in the OFF state, an applied bias voltage can be applied on the Schottky barrier of the bottom electrode 13. Thus, an electric field combination of the drain bias and the Schottky barrier can produce a strong SPCM signal. When the barrier transistor 30 is under the conditions of $(+V_G, +V_{DS})$ and $(-V_G, -V_{DS})$, that is, the barrier transistor 30 is turned on, the direction of the electric field caused by the applied bias voltage is the same as that of the electric field around the top electrode, and is opposite to the direction of the electric field around the bottom electrode. Photogenerated carriers are effectively separated by an enhanced local electric field around the top electrode, and the SPCM signal is generated around the top electrode. Therefore, the bottom electrode shows a strong SPCM signal, which means that the air gap at the edge of the bottom electrode widens the Schottky barrier on this side.

Figure 23:
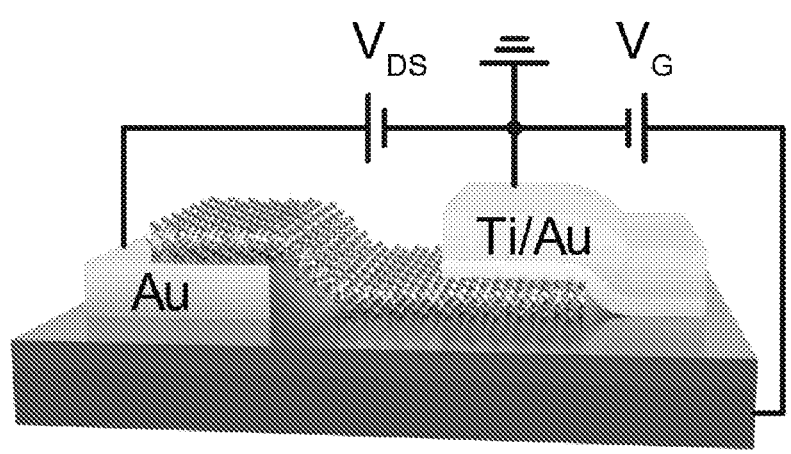
FIG. 23 is a structural diagram of the barrier transistor when the electrodes materials are Au—Ti/Au.
Figure 24:
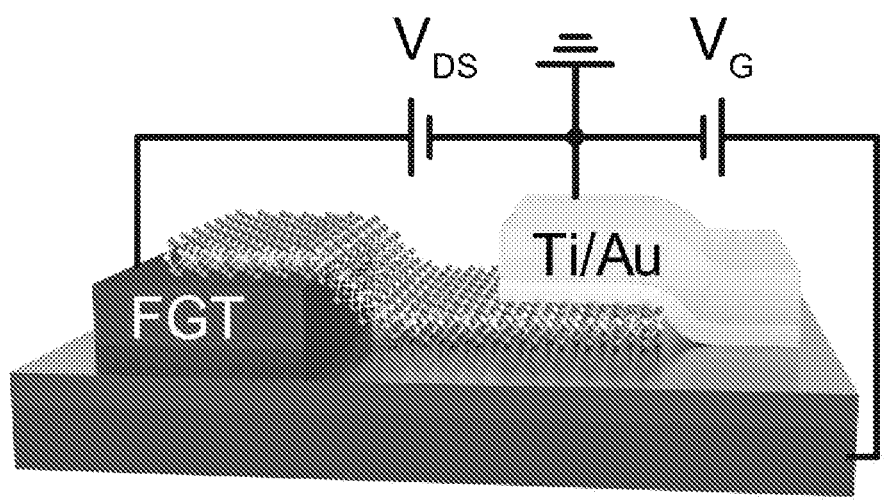
FIG. 24 is a structural diagram of the barrier transistor when the electrodes materials are $Fe_3GeTe_2$(FGT)-Ti/Au.
Figure 25:
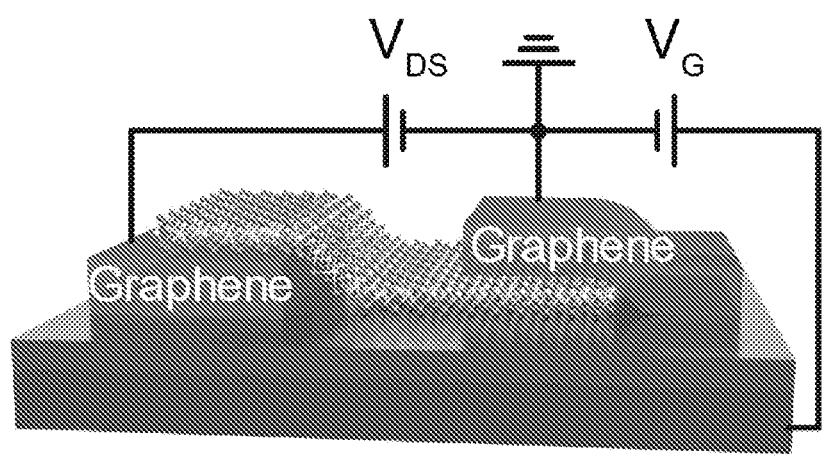
FIG. 25 is a structural diagram of the barrier transistor when the electrodes materials are Gr-Gr.
Figure 26:
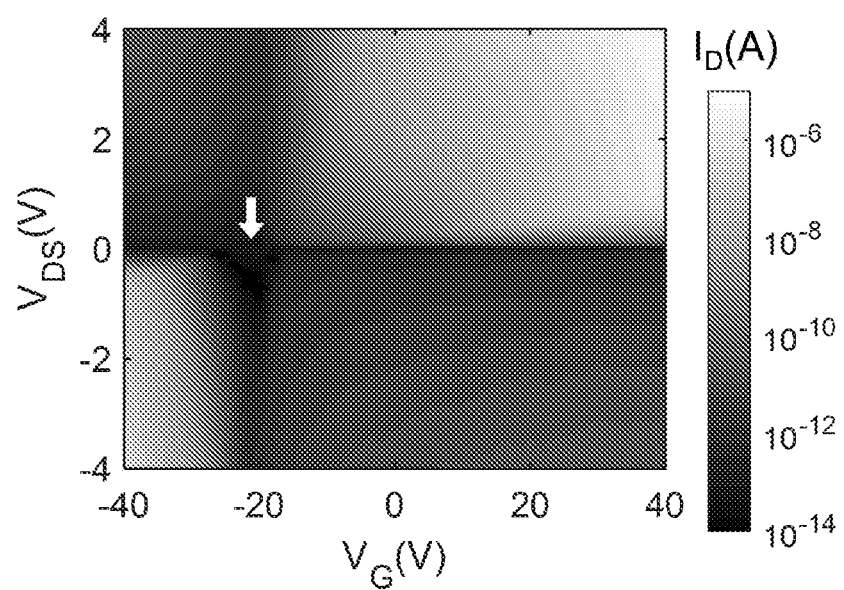
FIG. 26 is a diagram of electrical transport characteristics of the barrier transistor when the electrodes materials are Au—Ti/Au.
Figure 27:
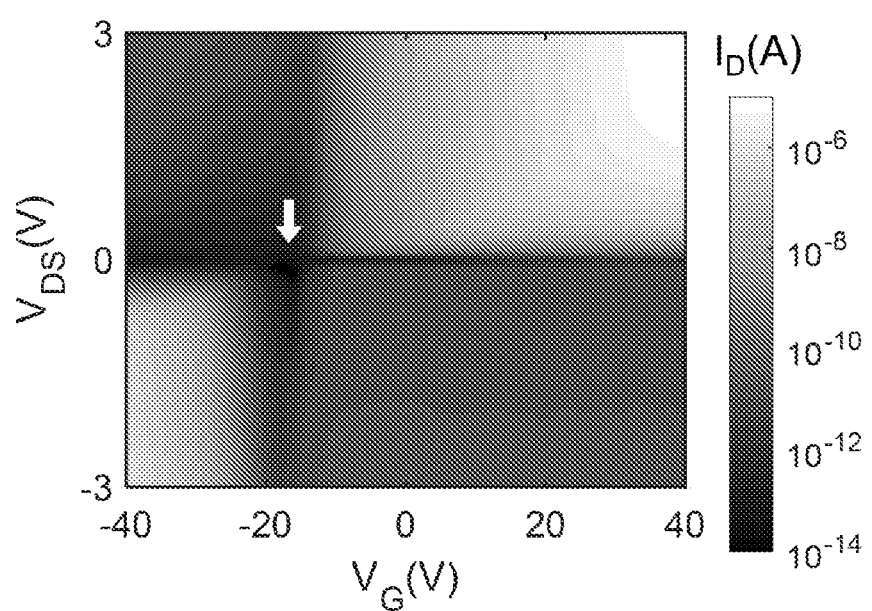
FIG. 27 is a diagram of electrical transport characteristics of the barrier transistor when the electrodes materials are FGT-Ti/Au.
Figure 28:
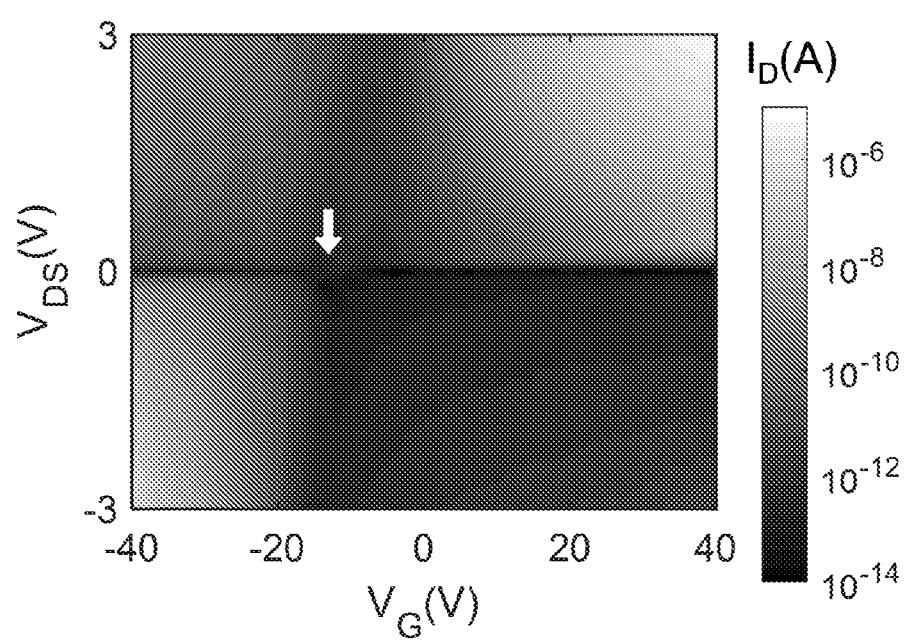
FIG. 28 is a diagram of electrical transport characteristics of the barrier transistor when the electrodes materials are Gr-Gr.
Figure 29:
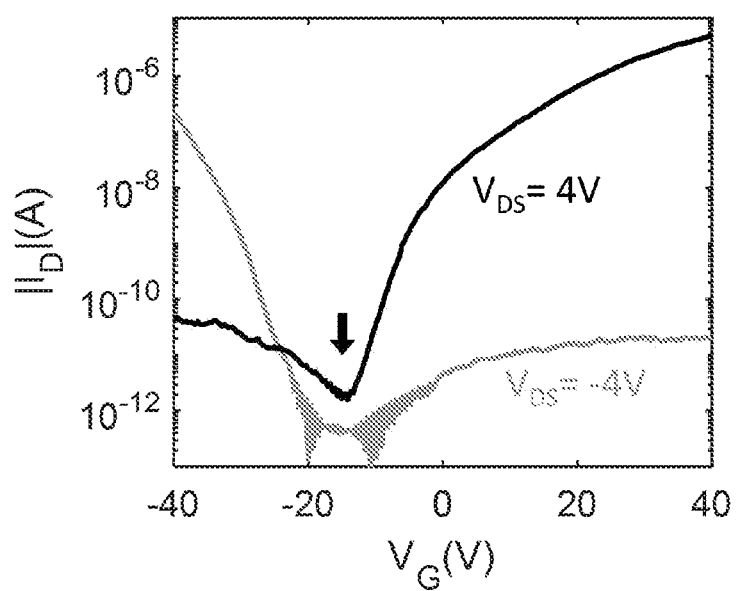
FIG. 29 is a transfer curve diagram of the barrier transistor when the electrodes materials are Au—Ti/Au.
Figure 30:
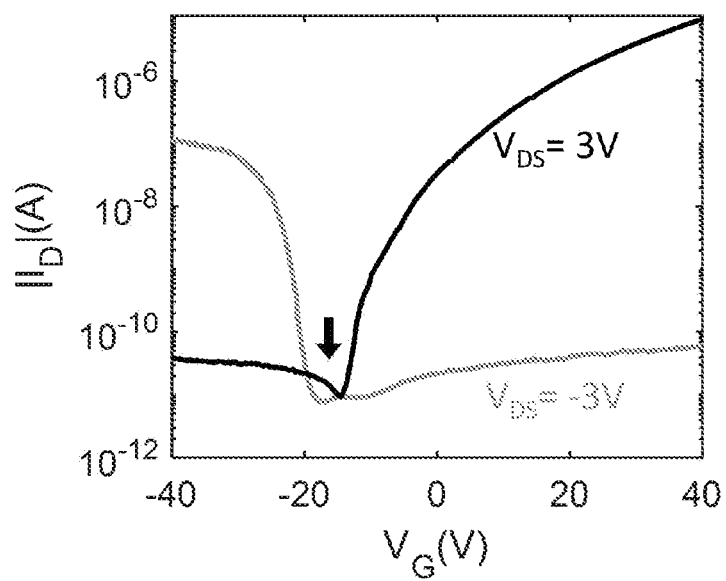
FIG. 30 is a transfer curve diagram of the barrier transistor when the electrodes materials are FGT-Ti/Au.
Figure 31:
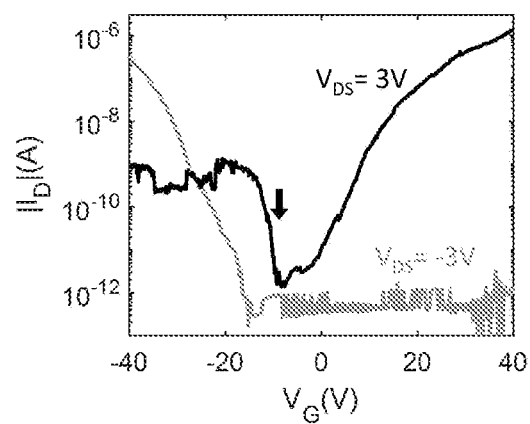
FIG. 31 is a transfer curve diagram of the barrier transistor when the electrodes materials are Gr-Gr.
Figure 32:
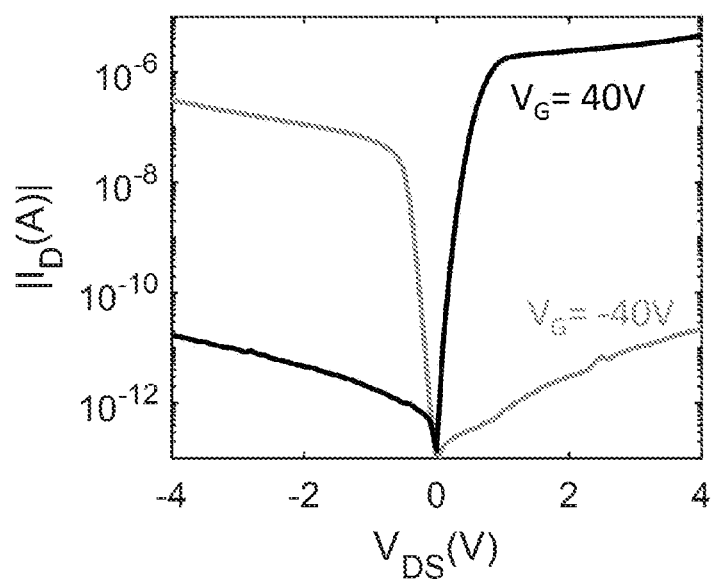
FIG. 32 is an output curve diagram of the barrier transistor when the electrodes materials are Au—Ti/Au.
Figure 33:
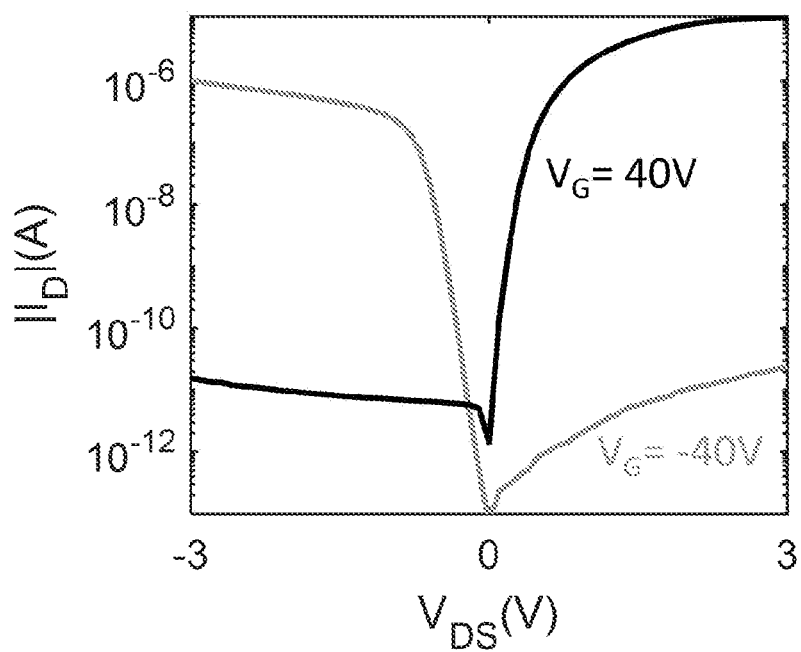
FIG. 33 is an output curve diagram of the barrier transistor when the electrodes materials are FGT-Ti/Au.
Figure 34:
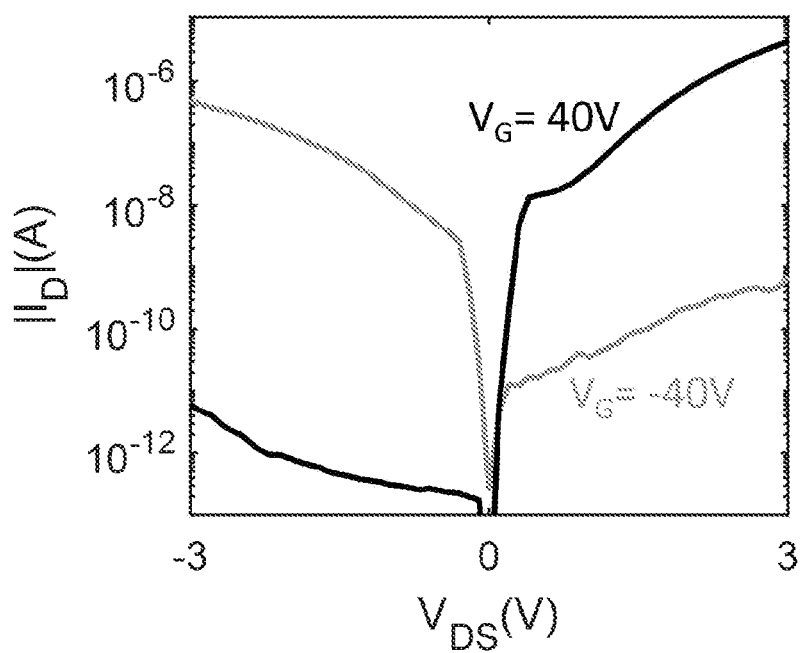
FIG. 34 is an output curve diagram of the barrier transistor when the electrodes materials are Gr-Gr.

Referring to FIGS. 23-25, three barrier transistors made of different electrode materials are provided. Three electrode materials are named according to the bottom electrode-top electrode, and are respectively Au—Ti/Au, FGT-Ti/Au, and Gr-Gr barrier transistors. Here, FGT refers to $Fe_3GeTe_2$, and Gr refers to graphene. Referring to FIGS. 26-28, the barrier transistor is in the OFF state under the conditions of $(-V_G, +V_{DS})$ and $(+V_G, -V_{DS})$, and is in the ON state under the conditions of $(+V_G, +V_{DS})$ and $(-V_G, -V_{DS})$ state. Referring to FIGS. 29-31, the transfer curve diagrams of the barrier transistors with the above electrode materials are provided. Referring to FIGS. 32-34, for barrier transistors whose electrode materials are Au—Ti/Au and FGT-Ti/Au, the on-off ratios of both n-type and p-type characteristics have exceeded $10^4$, and the rectification ratios in both directions have exceeded $10^5$. But for the barrier transistor whose electrode material is Gr-Gr, the switching ratio of the p-type characteristic exceeds $10^5$, and the forward rectification ratio even exceeds $10^6$. Performances of the barrier transistors of the above three materials are better than that of Au—Au electrode material, which may be due to a good electrical contact or van der Waals interface of the Ti adhesive layer. Furthermore, the above three barrier transistors exhibit more n-type behavior than Au—Au barrier transistors due to the shift of the neutral point to $-V_G$ in the electrical characteristic diagram and the shift of the transfer curves as indicated by the arrows, and this transition is due to the low work function of these electrode materials.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

Depending on the embodiment, certain of the steps of methods described may be removed, others may be added, and the sequence of steps may be altered. The description and the claims drawn to a method may comprise some indication in reference to certain steps. However, the indication used is only to be viewed for identification purposes and not as a suggestion for ordering the steps.

What is claimed is:

1. A logic gate device comprises:
   a gate electrode;
   a gate insulating layer, locating on the gate electrode;
   a bottom electrode, locating on a surface of the gate insulating layer away from the gate electrode;
   a two-dimensional semiconductor layer, locating on a surface of the bottom electrode away from the gate insulating layer and simultaneously covers the first surface of the gate insulating layer;
   a first top electrode and a second top electrode, locating on a surface of the two-dimensional semiconductor layer away from the gate insulating layer;
   wherein the bottom electrode, the two-dimensional semiconductor layer, and the gate insulating layer form air gaps, and the air gaps are distributed at opposite sides of the bottom electrode, the gate electrode is configured to connect a gate voltage, the first top electrode and the second top electrode are configured to connect with a signal input terminal, and the bottom electrode is configured to connect with a signal output terminal under a working voltage.

2. The logic gate device of claim 1, wherein a part of the two-dimensional semiconductor layer is in direct contact with a part of the gate insulating layer.

3. The logic gate device of claim 1, wherein the first top electrode and the second electrode are located at two sides of the bottom electrode respectively.

4. The logic gate device of claim 1, wherein the first top electrode and the second top electrode are both far away from the air gaps, and oppositely arranged on two sides of the air gaps respectively.

5. The logic gate device of claim 1, wherein when the first top electrode is in contact with the two-dimensional semiconductor layer at a first position, the two-dimensional semiconductor layer is also directly attached to the gate insulating layer at the first position.

6. The logic gate device of claim 1, wherein when the second top electrode is in contact with the two-dimensional semiconductor layer at a second position, the two-dimensional semiconductor layer is also directly attached to the gate insulating layer at the second position.

7. The logic gate device of claim 1, wherein the two-dimensional semiconductor layer comprises a material selected from a group consisting of black phosphorus, molybdenum telluride, tungsten selenide, and semiconducting carbon nanotubes.

8. The logic gate device of claim 1, wherein the two-dimensional semiconductor layer is a freestanding structure.

9. The logic gate device of claim 1, wherein a thickness of the two-dimensional semiconductor layer is in a range between 5 nanometers to 20 nanometers.

10. The logic gate device of claim 1, wherein a part structure of the two-dimensional semiconductor layer is overlapped on the surface of the bottom electrode away from the gate insulating layer, another part structure of the two-dimensional semiconductor layer is tiled on the surface of the gate insulating layer away from the gate electrode.

11. The logic gate device of claim 1, wherein the two-dimensional semiconductor layer is disposed in direct contact with the gate insulating layer and the bottom electrode at the same time.

12. The logic gate device of claim 1, wherein the two-dimensional semiconductor layer is an integral structure, and the two-dimensional semiconductor layer extends from the surface of the bottom electrode to the surface of the gate insulating layer.

13. The logic gate device of claim 1, wherein the bottom electrode is disposed on middle of the gate insulating layer, and the two-dimensional semiconductor layer covers the bottom electrode to form the air gaps on the opposite sides of the bottom electrode.

\* \* \* \* \*